(12) United States Patent
Thibault et al.

(10) Patent No.: US 11,295,044 B2
(45) Date of Patent: Apr. 5, 2022

(54) SYSTEM FOR THE DYNAMIC DETERMINATION OF THE ENVIRONMENTAL FOOTPRINT LINKED TO THE OVERALL MOBILITY OF A USER

(71) Applicant: IFP Energies nouvelles, Rueil-Malmaison (FR)

(72) Inventors: Laurent Thibault, Lyons (FR); Gilles Corde, Igny (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 860 days.

(21) Appl. No.: 16/145,492

(22) Filed: Sep. 28, 2018

(65) Prior Publication Data
US 2019/0102509 A1 Apr. 4, 2019

(30) Foreign Application Priority Data

Sep. 29, 2017 (FR) .................................... 17/59.128

(51) Int. Cl.
*G06F 30/15* (2020.01)
*G06Q 10/00* (2012.01)
(Continued)

(52) U.S. Cl.
CPC ............. *G06F 30/15* (2020.01); *B60W 40/09* (2013.01); *G06F 30/20* (2020.01); *G06Q 10/00* (2013.01); *G06Q 50/30* (2013.01)

(58) Field of Classification Search
CPC ........ G06F 30/15; G06F 30/20; B60W 40/09; G06Q 10/00; G06Q 10/04; G06Q 50/30;
(Continued)

(56) References Cited

U.S. PATENT DOCUMENTS

| 2004/0093264 A1 | 5/2004 | Shimizu |
| 2009/0069999 A1* | 3/2009 | Bos .................. G07C 5/008 701/102 |

(Continued)

FOREIGN PATENT DOCUMENTS

| CN | 205010009 U | 2/2016 |
| FR | 3 049 653 A1 | 10/2017 |

(Continued)

OTHER PUBLICATIONS

Barth et al. "NCHRP Project 25-11 Final Report: The Development of a Comprehensive Modal Emissions Model". NCHRP Project 25-11. Apr. 2000. 435 Pages. (Year: 2000).*

(Continued)

*Primary Examiner* — Eunhee Kim
(74) *Attorney, Agent, or Firm* — Fitch, Even Tabin & Flannery LLP

(57) ABSTRACT

The present invention is a system for dynamic determination of an environmental footprint linked to the overall mobility of a user, comprising means for measuring a trip made by the user using a smart phone application which detects modes of mobility and modes of mobility in a motorized vehicle and style of driving; means for calculating a pollution footprint of the user, accounting for the real usage and global and local pollutants emitted during a given time interval using a server or onboard electronics in a control unit or in a connected vehicle; and means for exploiting the pollution footprint, including a connected object informing one of the user and the administrative authorities of the pollution footprint.

18 Claims, 1 Drawing Sheet

(51) Int. Cl.
*B60W 40/09* (2012.01)
*G06Q 50/30* (2012.01)
*G06F 30/20* (2020.01)

(58) Field of Classification Search
CPC ... G06Q 30/018; G08G 1/0125; G08G 1/0137
See application file for complete search history.

(56) References Cited

U.S. PATENT DOCUMENTS

| | | | | |
|---|---|---|---|---|
| 2011/0106370 | A1* | 5/2011 | Duddle | G06Q 40/08 701/31.4 |
| 2012/0290652 | A1* | 11/2012 | Boskovic | G06Q 50/30 709/204 |
| 2014/0039988 | A1* | 2/2014 | Londergan | G06Q 30/0207 705/14.1 |
| 2015/0206166 | A1* | 7/2015 | Fletcher | G06Q 10/06 705/14.27 |
| 2016/0086166 | A1* | 3/2016 | Pomeroy | G06Q 20/4018 705/40 |
| 2016/0203435 | A1* | 7/2016 | Waltniel | G06Q 10/063118 705/7.17 |
| 2016/0283963 | A1* | 9/2016 | Zafiroglu | G06Q 30/02 |
| 2018/0060204 | A1* | 3/2018 | Jin | G06F 11/3438 |
| 2019/0057558 | A1* | 2/2019 | Gupta | G08G 1/0129 |

FOREIGN PATENT DOCUMENTS

| | | |
|---|---|---|
| WO | 2007/104982 A2 | 9/2007 |
| WO | 2014/062429 A1 | 4/2014 |
| WO | 2016/142733 A1 | 9/2016 |

OTHER PUBLICATIONS

Kurniawan. "Comparison of methodologies estimating emissions of aircraft pollutants, environmental impact assessment around airports". Environmental Impact Assessment Review 31 (2011) 240-252. (Year: 2011).*

Barth et al. "Integrating a Comprehensive Modal Emissions Model into ATMIS Transportation Modeling Frameworks". UCB-ITS-PRR-2001-19. Aug. 2001. 55 Pages. (Year: 2001).*

Ezeah et al. "A Critical Review Of The Effectiveness Of Low Emission Zones (LEZ) As A Strategy For The Management Of Air Quality In Major European Cities". Journal of Multidisciplinary Engineering Science and Technology (JMEST). ISSN: 3159-0040 vol. 2 Issue 7, Jul. 2015. (Year: 2015).*

* cited by examiner

SYSTEM FOR THE DYNAMIC DETERMINATION OF THE ENVIRONMENTAL FOOTPRINT LINKED TO THE OVERALL MOBILITY OF A USER

CROSS REFERENCE TO RELATED APPLICATIONS

Reference is made to French Application No. 17/59.128 filed Sep. 29, 2017, which is incorporated herein by reference in its entirety.

BACKGROUND OF THE INVENTION

Field of the Invention

The present invention relates to the field of modelling pollution emissions linked to the mobility of a user, for real usage.

Description of the Prior Art

Improving air quality in an urban environment is a major challenge today. One way of achieving it is to put Regulated Critical Areas (RCA) in place. At the moment, access to these areas is determined by a sticker system, which is solely a function of the year of manufacture and the vehicle fuel. However, for a given vehicle, the levels of emissions can vary from one to three times depending on the style of driving and the type of journey (traffic, incline, etc). Current "air quality" stickers only take the year of manufacture and vehicle fuel into account. However, vehicle usage has a substantial impact on pollutant emissions, but the only currently available means for capturing the impact of usage on emissions is to add measuring systems at the exhaust. These latter are expensive, bulky instrumentation systems which means that it is impossible to roll them out to the public at large.

The French patent application FR 3 049 653, which concerns a method for determining pollutant emissions from a vehicle using macroscopic parameters, describes a system for estimating the pollution emissions from a vehicle using macroscopic parameters, but cannot be used to estimate the nature of pollution of the overall mobility of a user both when the vehicle is being used and when other modes of transport are being used.

US published patent application 2004/093264 pertains to the generation of eco-driving guidance using a hardware and software solution. The solution can be used to inform the driver of the driver's footprint relative to fuel consumption and $CO_2$ emissions. However, the solution does not deal with the air quality component (local pollutants), and cannot be used in the context of traffic restriction devices. In addition, means of transport other than by car are not taken into consideration.

Patent application WO14/062429 entitled "Apparatus and Methods for Providing City Services" also pertains to a system which can be used to reduce pollution in cities by means of sensors. It describes providing services to users with kiosks which cause at least one of the nature and price of those services to be varied as a function of the conditions measured by sensors. The system may, for example, be used to vary the cost of parking places as a function of measurements from an air quality sensor.

Patent application WO2016142733 entitled "System and Method for Use in Connection with Pollutant Emissions" pertains to a system allowing users to compensate for pollution emissions of their mobility. In this regard, the system can be used to measure or estimate pollution emissions from trips by car. However, that system does not take mobility in the broad sense (other than in the car) into account. In addition, there is no description of a method, however complex, by which the estimation of local pollutant emissions is carried out. In that application, the estimation of the pollution emissions is used for carrying out compensating actions (planting trees, for example).

US published patent application 2009/0069999 entitled "On board Trip Computer for Emissions Subject to Reduction Credit" proposes a system for estimating the carbon footprint of a vehicle without using additional instrumentation. To this end, the system integrates the software estimators in the control unit of the vehicle. Thus, such a system is by nature limited to the emissions from a single vehicle. Thus, it cannot consider the overall pollution emissions of a user. In addition, such an approach necessitates the cooperation of automobile manufacturers, which could constitute a major obstacle for a city wanting to provide a traffic regulation system based on the pollution emissions.

US published patent application 20140039988 entitled "Method and System for Controlling Traffic Pollution" concerns a system for estimating the pollution footprint of a vehicle with a goal to regulate traffic in certain areas, but it cannot be used to estimate the footprint for the mobility of a user in the broad sense (bus, bicycle, walking). The vehicle has to be equipped with a device for measuring pollution emissions. This point implies very high large-scale roll-out costs for the system.

Chinese utility model CN205010009U, entitled "Automobile Pollution Monitoring Device", also pertains to a system for measuring pollution emissions for real usage of a vehicle. However, it is necessary to place instruments in the vehicle. Furthermore the system does not account for emissions linked to modes of mobility other than from the car.

SUMMARY OF THE INVENTION

The present invention can be used to overcome the set of defects identified in the prior art.

In particular, the present invention is a complete system which, without any additional sensors, can be used to measure the usage and the mobility of the driver to control access to certain areas. This is made possible by using an application on a smart phone (also known as a smart phone app) or directly via the interface of a connected vehicle, coupled with computing models on servers, which means that a network of physical sensors can be dispensed with.

The present invention accesses computer models for estimating local pollutants on a server, which means that this estimation of the most common local pollutants can be carried out without any additional sensors, which represents a major benefit for large scale deployment of the system. Furthermore, the purpose of the system in accordance with the invention is to allow the user to take action regarding the user's pollutant emissions in real time in order to provide access to restricted traffic areas.

The present invention is a method and a complete system for estimating the level of pollution emissions resultant from real usage of a vehicle, that is by accounting for both the vehicle as well as the usage made of it. The invention also pertains to a connected air quality sticker for carrying out a dynamic exploitation of the information provided by the system. In order to allow large scale deployment, the present invention may be deployed with a smart phone as the only sensor.

More particularly, the present invention concerns a system for determining pollution emissions for real usage, at the center of which is an object used to replace current, static "air quality" stickers by a dynamic rating by taking usage into account. It then becomes possible to establish Regulated Critical Areas (RCA) which also accounts for the behaviour of the users and not only the year of manufacture of their vehicle.

To this end, the invention provides a complete software and hardware solution which is used to automatically and dynamically measure the complete pollution emissions (local and global pollutants) resulting from the technology of the vehicle and the usage (style of driving and modes of transport used), to calculate and display the associated pollution footprint and to communicate with the infrastructure, for example in order to provide access to restricted areas. This method can be rolled out on a large scale because of its reduced cost resulting from requiring only minimal instrumentation in the vehicle and the use of software estimation modules.

"Local pollutants" or "local pollution" primarily mean oxides of nitrogen (NOx), fine particles, carbon monoxide (CO), unburned hydrocarbons (HC), sulphur dioxide, while the "global pollutants" primarily refer to $CO_2$ and to greenhouse gases.

The invention is a system for providing dynamic determination of an environmental footprint linked to overall mobility of a user, comprising:
a) means for measuring a trip made by a user via a smart phone application which detects soft modes of mobility and modes of mobility in a motorized vehicle as well as style of driving;
b) means for calculating the pollution footprint of the user, taking into account the real usage and global and local pollutants emitted during a given time interval which is a calculation server or onboard electronics in a control unit or in a connected vehicle; and
c) means for exploiting the pollution footprint, comprising a connected object in order to inform at least one of the user and the administrative authorities.

Preferably, the connected object comprises at least:
a) means for displaying the environmental footprint;
b) means for communicating with the smart phone, the server and the road infrastructure;
c) means for identifying the vehicle;
d) an energy storage and supply means.

The measuring means may comprise at least one of a connected control unit, a connected vehicle and a connected wristwatch.

The means for calculating the pollution footprint may employ an onboard physical sensor for specific local pollutants.

The means for exploiting the pollution footprint may comprise means for communicating with the road infrastructure.

Preferably, the connected object is a dynamic "air quality" sticker.

Advantageously, the "air quality" sticker communicates the environmental footprint directly to the road infrastructure to provide the user with at least one of access regulated critical areas and preferential parking places.

Preferably, the "air quality" sticker displays the environmental footprint of the user, in particular by use of a color code or an indicator.

In another embodiment, the connected object is integrated into one of the smart phone, the connected control unit, the connected vehicle and the connected wristwatch.

The invention also is a method for the dynamic determination of the environmental footprint linked to mobility of a user using the system and comprising the following steps:
a) measuring a trip made by the user by use of a smart phone application detecting soft modes of mobility and modes of mobility in a motorized vehicle, and a style of driving;
b) calculating the pollution footprint of the user for a given time interval by accounting for the real usage and the global and local pollutants emitted during the time interval;
c) displaying the environmental footprint linked to the mobility of the user and information regarding the user and the administrative authorities by one of a mobile connection or a wireless connection.

The pollution footprint may be calculated by aggregating all of the pollutant emissions linked to local and global pollutants in a single benchmark, the benchmark being obtained by producing a weighted sum of the emissions for each pollutant under consideration in grams per kilometer, the coefficients of the weighted sum being selected as a function of impact on health and the environment.

In order to calculate the pollution footprint, it is possible to calculate pollutant emissions linked to the motorized vehicle employed by the user by acquiring at least one macroscopic parameter relating to design of the vehicle, and construction of the vehicle:
a model of the vehicle linking at least one of position, altitude, and speed of the vehicle to torque and speed of the engine by use of at least one macroscopic parameter;
a model of the engine linking the torque and the speed of the engine to pollution emissions in the exhaust from the engine by use of at least one macroscopic parameter; and
optionally, a model of the post-treatment system linking the pollution emissions at the exhaust from the engine by use of the pollution emissions in the exhaust from a post-treatment system by use of at least one macroscopic parameter;
and by carrying out the following steps:
measuring position, altitude and speed of the vehicle by use of a tracking system or a mobile phone;
determining the torque (Cme) and the speed (Ne) of the engine by use of the vehicle model and the measurements;
determining the pollution emissions in the exhaust from the engine by use of the engine model, the torque (Cme) and the speed (Ne) of the engine; and
optionally, determining pollution emissions from the vehicle by use of the model of the post-treatment system and the pollution emissions in the exhaust from the engine.

Preferably, initially, a pollution footprint is calculated for each route j, then a mean pollution footprint is calculated for the series of n routes travelled over the time interval, which may or may not comprise routes traversed in soft modes of mobility, with j being a whole number from 1 to n.

Preferably, the time interval ranges from 1 day to 1 month.

Preferably, the global pollutants are selected from carbon dioxide and other greenhouse gases and the local pollutants are selected from oxides of nitrogen, carbon monoxide, fine particles, unburned hydrocarbons and sulphur dioxide.

BRIEF DESCRIPTION OF THE DRAWINGS

Other characteristics and advantages of the method in accordance with the invention will become apparent from the description below of non-limiting exemplary examples, made with reference to the accompanying figures and described below.

DETAILED DESCRIPTION OF THE INVENTION

The invention transforms the current traffic restricting device which is based on "static" stickers which solely accounts for the technology of the vehicle, into a connected sticker which is also capable of capturing the usage and behavior of the driver. The dynamic system for determining pollution emissions in accordance with the invention can be used to return the driver to the center of improving air quality by making the driver aware of the driver's impact and inciting the driver to improve.

Specifically, this means that the air quality certificate is dynamic and can vary as a function of the driver's usage. The usage, which is taken into account, may be at least one of style of driving (aggressive or smooth driving) and the modes of transport employed, in particular in order to favor soft modes of transport for short journeys.

Figure 1:
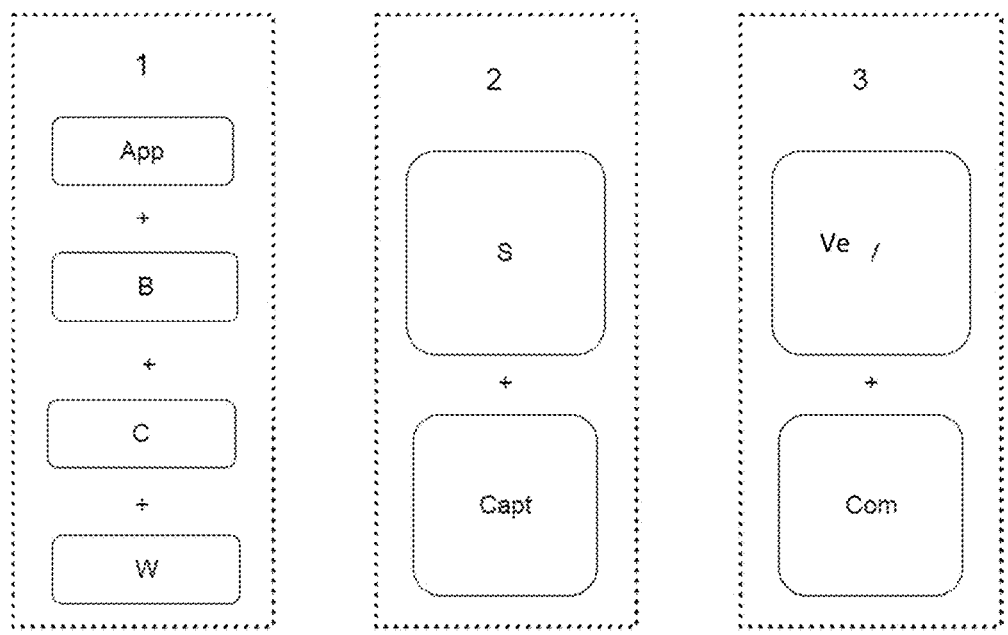
FIG. 1 illustrates the steps of the method for the determination of pollution emissions and the means associated with the system in accordance with the invention.

FIG. 1:

As can be seen in FIG. 1, the function of the connected sticker (V) allowing pollution emissions to be determined for real usage, in accordance with the invention, may be broken down into 3 steps:
1. Measuring the usage with a smart phone application, and optionally one of a connected control unit, a connected vehicle, a connected wristwatch and any analogous connected object.
2. Calculating pollution footprint using one of a calculation server and onboard electronics, and optionally the system may employ an onboard sensor for specific pollutants.
3. Exploitation of the pollution footprint using a connected object informing the driver and the authorities (dynamic sticker), and optionally communicating with the road infrastructure in order to authorize access to certain areas.

More precisely, the method in accordance with the invention comprises the following steps:

The first step measures the usage, that is principally style of driving, but also optionally the alternative modes of transport being used (bicycle, bus, etc). This measurement will principally be based on the GNSS (Global Navigation Satellite System) sensor in a smart phone in order to facilitate roll-out of the system or by a smart phone application (App). Optionally, other sensors can be added to improve precision. These sensors may, for example, be a connected control unit (B) plugged into the OBD socket of the vehicle, directly communicating with the vehicle (Ve) if this is available, or in fact a connected wristwatch (W) which can precisely capture the alternative modes of transport (soft modes of mobility).

A. Detection of Soft Modes of Mobility

Soft modes of mobility, that is non-emitting, have to be taken into account when evaluating the environmental footprint for overall mobility, since they may be chosen as a substitute for polluting mobility solutions. The system in accordance with the invention can thus be used for the automatic detection of walking, running and bicycle riding while limiting battery consumption as much as possible.

B. Detection of Trips in a Motorized Vehicle

The system in accordance with the invention is intended to automatically detect trips in motorized vehicles via a smart phone, by maximizing the sensitivity of detection at the start of each route and the accuracy of the collected data, while limiting the battery consumption by the function. This function does not require the constant use of tracking (GNSS). It is based on the observation of at least one of GSM antenna changes and the identification of the type of activity of the user detailed in the preceding section. When an antenna change is detected or the activity currently being detected is in the car, the GNSS sensor of the smart phone is activated for a given period. If the recorded speed measurements correspond well to the case in which a motorized vehicle is used, then recording of a fresh motorized vehicle trip is launched and the GNSS remains activated until the trip is finished. While travelling, the speed and altitude signals are recorded at all times, which means that the style of driving can intrinsically be taken into account. The end of the route is determined by the status of the speed. At the end of the route, the recorded data are sent to a server or stored locally for subsequent onward transmission (in particular in the case in which there is no network at the end of the route).

The identification of the motorized vehicle used for each trip may be carried out either by reporting to the user, or automatically by comparing the route followed with certain known routes (tramway, bus, etc).

The second step calculates the pollution footprint. This calculation is initially carried out route by route, then a mean footprint is calculated for a given time interval (for example 1 day, 1 week or 1 month). This mean may or may not take into account soft modes of mobility. This calculation may be exported to a calculation server (S) (when there is no control unit in the vehicle) or accommodated directly in the electronics of the control unit or the connected vehicle (onboard electronics). Optionally, a physical onboard sensor (Capt) may be added to the system in order to improve its precision.

In order to obtain overall information pertaining to the environmental footprint of a trip in a motorized vehicle, the present invention may use a macroscopic approach such as that described in patent application FR 3 049 653 which uses a method for determining pollution emissions from a vehicle in which a model of the vehicle, a model of the engine and a model of the post-treatment system is constructed, and the position, altitude and speed of the vehicle are measured using a tracking system or a mobile telephone. The measurements and the models are used in order to determine the global and local pollutant emissions. In particular, the calculation of the pollution emissions from the vehicle used by the user comprising an internal combustion engine and optionally a post-treatment system for the exhaust gases from the engine may be carried out using a method for determining the pollutant emissions from a vehicle, in which at least one macroscopic parameter which is related to the design of the vehicle is acquired, and in which the following is constructed for said vehicle:

i) a model of the vehicle which links at least one of position, altitude and speed of the vehicle to torque and speed of the engine by use of at least one macroscopic parameter;

ii) a model of the engine which links the torque and the speed of the engine to pollution emissions at the exhaust from the engine by use of at least one macroscopic parameter; and iii) optionally, a model of the post-treatment system which links the pollution emissions in the exhaust from the engine by use of the pollution emissions at the exhaust from the post-treatment system by use of at least one macroscopic parameter;

wherein the following steps are carried out:

a) measuring the position, the altitude and the speed of the vehicle by use of a tracking system or a mobile phone;

b) determining the torque (Cme) and the speed (Ne) of the engine by use of the vehicle model and the measurements;

c) determining the pollution emissions at the exhaust from the engine by use of the engine model and the torque (Cme) and the speed (Ne) of the engine; and d) optionally, determining the pollution emissions from the vehicle by use of the model of the post-treatment system and the pollution emissions at the exhaust from the engine.

More precisely, the system in accordance with the invention may make use of a calculation of the overall environmental footprint of the mobility of a subject over a given time interval or over a given route accounting for the style of driving, making use of a detection of soft modes of mobility which do not emit pollutants and a detection of trips in a motorized vehicle and their associated pollution emissions, as described above. To this end, the series of pollution emissions generated by each of the movements over a given period, for example over the course of a day (irrespective of the mode), are aggregated into a single benchmark where the various pollutants are taken into account in proportion to their danger levels.

The benchmark for the pollutant points is obtained by producing a weighted sum of the emissions for each pollutant under consideration, in grams per kilometer. The coefficients of this weighted sum are selected in order to be representative of the impact of the various pollutants on health and on the planet. This choice may, for example, be based on the "external cost method" proposed by the European Commission in particular.

Calculation of the Environmental Footprint of the Route Taking the Style of Driving into Account Advantageously, for each route j carried out using a vehicle k, a value $POPS_{j,k}$ is determined by producing a weighted sum of cumulative pollution emissions for each pollutant i. The various pollutants are taken into account in proportion to their danger level. The weighted factors $\alpha_1$ for the various pollutants have been calculated using the external cost method (state of the art in the measurement of societal impact). These factors reflect the danger level of each pollutant and are independent of the vehicle.

$$POPS_{j,k} = \sum_i \alpha_i \times \phi_{i,j,k}^{[\frac{g}{km}]}$$

A non-exhaustive list of the pollutants considered is given below:

carbon dioxide, a greenhouse gas
oxides of nitrogen
carbon monoxide
fine particles
unburned hydrocarbons
sulphur dioxide In the case of shared transport (public transport or car sharing), a weighting may be applied in order to normalize the emissions to the number of users.

The cumulative emissions $$\phi_{i,j,k}^{[\frac{g}{km}]}$$

for each pollutant i over the route j with the vehicle k are calculated by integrating instantaneous pollution emissions over the route $$\psi_{i,j,k}^{[\frac{g}{h}]}(t),$$

which are themselves calculated using pollutant models, for example as described above (macroscopic approach).

From a macroscopic point of view, this calculation can be expressed by the following equations:

$$\begin{cases} \phi_{i,j,k}^{[\frac{g}{km}]} = \int_{t_i}^{t_f} \psi_{i,j,k}^{[\frac{g}{h}]}(t) dt \\ \psi_{i,j,k}^{[\frac{g}{h}]}(t) = f_k(V_j(t), Alt_j(t), T_j(t), spec_k) \end{cases}$$

in which:

$V_j(t)$ is the vehicle speed and $Alt_j(t)$ are the speed and altitude profiles measured by the GNSS over the route j $T_j(t)$ is the outside temperature, recalculated from the GNSS coordinates $f_k$ is the model used for the vehicle k, and $spec_k$ are the technological specifications for the vehicle used to parameterize the models which are, for example:

the type of engine (gasoline, diesel, etc)
the level of the certification standard (Euro 1, Euro 2, . . . )
the number of cylinders
the maximum torque and the associated engine speed
the maximum power and the associated engine speed
the mass of the vehicle
the type of vehicle transmission
the type of post-treatment system
the type of injection system
the degree of hybridization Calculation of the Overall Environmental Footprint for the Mobility Over a Given Time Interval The set of pollution footprints generated by each of the trips over a given time interval, for example during the course of a day (irrespective of the mode), are aggregated in order to provide a single indicator over said time interval. This aggregation is carried out by calculating a mean weighted by the distances covered during each route, $d_j^{[km]}$, using the following formula:

$$POPS_{day} = \frac{\sum_j d_j^{[km]} * POPS_{j,k}}{\sum_j d_j^{[km]}}$$

Finally, the information regarding the environmental footprint may be fed back to the user in the form of a connected object V present in the vehicle for which the colour could be varied, for example to indicate the level of the equivalent air quality sticker (dynamic air quality sticker), or directly onto the smart phone or display interface of the connected vehicle. As an alternative to color, the environmental footprint may be fed back to the user in the form of a numbered indicator, on the sticker, on a smart phone or on any other analogous connected object. This connected object may also optionally communicate directly with the road infrastructure in order to authorize entry to regulated critical areas (Com).

Figure 2:
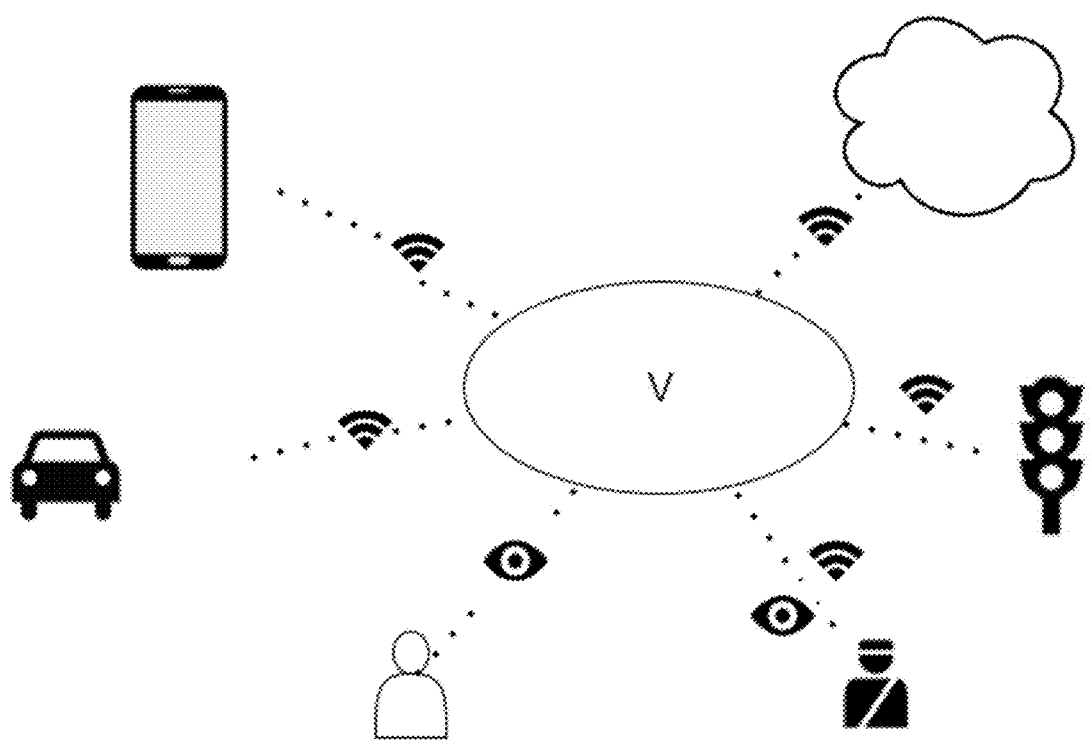
FIG. 2 illustrates the ecosystem of the connected sticker in accordance with the invention, in particular the interfaces enabling exchanges to be carried out.

FIG. 2:

FIG. 2 represents the system in accordance with the invention and its ecosystem in order to explain the exchanges and interfaces for the connected sticker V.

Interface with the Driver and the Authorities

Visual Monitoring

The connected sticker V allows for visual feedback of information for the driver regarding the pollution footprint of his mobility. This information may also be monitored visually by the authorities in the same manner as current air quality stickers. The sticker may thus change color as a function of the value of the environmental footprint of the vehicle and of its usage. As an example, a palette of ten colors may thus be used which reflects the intensity of the pollution emissions: mid green, pale green, blue-green, blue, violet; pale yellow, yellow, orange, pink, red, in order to provide a range of pollution footprints ranging from the least polluting to the most polluting. The use of colors allows for direct visual monitoring of the pollution footprint of the vehicle.

Wireless Monitoring

By means of data transmission using various receiving devices (Bluetooth, Wi-Fi, mobile, etc), the authorities may also receive the pollution emissions score given out when monitoring over a given perimeter.

Interface with Smart Phone Application

The smart phone app (or smart phone application) fulfils a number of functions:

Allowing the user to interrogate his license plate in order to find out specific technical information regarding his vehicle.

Detecting trips in the car and recording instantaneous GNSS trace (inclination and speed). When communicating with the connected sticker, it is then useful to transmit a unique identifier in order to know which vehicle is being used.

Detecting alternative modes of transport (bus, bicycle, walking) for the user in order to measure the overall pollution footprint of the user and not simply the portion linked to his vehicle. If the user is equipped with a connected wristwatch, the sensors in it are automatically taken into account because they are coupled to his smart phone.

Interface with the Connected Vehicle or a Control Unit

Optionally, the connected sticker can exchange with a connected control unit or directly with the vehicle. This exchange can be used to install supplemental measurements in order to refine the estimation of the pollutants.

In the case of a connected control unit, plugging into the OBD (On Board Diagnosis) socket means that messages circulating on the OBD as well as on the CAN (Control Area Network) bus, such as the instantaneous engine speed, for example, can be read. This information may be transmitted either directly to the server using a connection to a mobile network (type 4G) or by going via the smart phone with the aid of a wireless communication (for example Bluetooth). This exchange architecture may also be used to communicate directly with a vehicle which does not have a control unit, if a vehicle allows exchange of communications.

The connected control unit may also optionally carry out the calculation of the pollution emissions in order to dispense with the smart phone and the connection to the server.

Interface with the Server

The server can carry out the calculation of the pollution emissions. It may thus communicate the result of the pollution footprint to the sticker directly, or indirectly via the smart phone. Advantageously, the server also accommodates a database of emissions for real usage which allows cities to carry out dynamic monitoring and to project emissions levels to all users on a map of their territory.

Interface with Road Infrastructure

The connected sticker or connected object may communicate directly with the road infrastructure in order to provide advantages which reward drivers with a reduced pollution footprint. Examples of these advantages may be:

access to certain regulated critical areas;

access to preferential conditions for some parking spaces;

reductions in some tolls.

In a variation, the invention provides the sticker virtual. In this case, the exchanges are no longer centralized in the connected sticker (which no longer exists), but directly in the smart phone. In this case, it is the smart phone itself which will communicate directly with the infrastructure and the authorities in order to display the level of pollution footprint of the user as well as the associated traffic authorisations.

In another embodiment, when the vehicle is a connected vehicle, at least one of the smart phone application and the connected sticker are integrated directly into the vehicle.

Connected Dynamic "Air Quality" Sticker

The connected dynamic "air quality" sticker is advantageously composed of four modules:

the module for displaying the environmental footprint which, by use of a screen or LED, a color code or numbered indicator which allows the driver and the authorities to determine the class of pollution footprint of the vehicle for real usage;

the communication module allows:

on the one hand, exchange with at least one of the server, the smart phone, the control unit and the connected vehicle recovery of the "environmental footprint" information;

and communication with the infrastructure (tolls, barriers, etc) in order to authorize access to certain areas;

the vehicle identification module can be used to communicate to the smart phone a unique identifier associated with each vehicle, for example by indicating the license plate of the motorized vehicle. It is then possible to determine with precision the starts and ends of a route, as well as the characteristics of the vehicle used for the route;

the module for supplying and storing energy means that an object is provided which is supplied autonomously, for example by a battery.

The major innovation of the invention is taking real usage into account, without the need for instrumentation on the vehicle, without a complex parameterization step carried out by the user and with a very short calculation period. These three points mean that the system, the method and the connected sticker in accordance with the invention are adapted to large scale deployment, which is not the case with alternative solutions.

More precisely, the advantages of the invention compared with a conventional air quality sticker and compared with prior art methods for the determination of pollutant emissions are therefore:

- The possibility of measuring the overall footprint for the mobility of a user, and not only that linked to trips in a car.
- The possibility of measuring the pollution footprint of a user without needing an additional sensor.
- The solution can readily be deployed on a large scale because of the reduced cost (via the use of a smart phone application in order to estimate the pollution footprint) compared with pollutant measuring stations.
- The invention makes it possible for cities to regulate access to regulated critical areas by taking into account the usage and not simply the technology of the vehicle.
- The invention may be used to provide better representativity because usage is captured.
- The invention may be used to make users aware of their responsibility and their ability to act upon air quality.
- Acceptability by the public at large becomes better in that in the current system, the right to move in traffic is a direct function of the year of manufacture and thus indirectly of the value of the vehicle, which is discriminatory from a social viewpoint. With the air quality sticker in accordance with the invention, everyone can obtain greater traffic movement rights by adapting the usage made of the vehicle.
- For cities, it become possible to monitor the environmental efficiency of the infrastructure and of the associated regulations directly.

The invention claimed is:

1. A system for the dynamic determination of environmental footprint linked to overall mobility of a user, comprising:
   a) a smart phone for measuring a trip made by using a smart phone application which detects soft modes of mobility and modes of mobility in a motorized vehicle as well as a style of driving;
   b) a calculation server for calculating a pollution footprint of the user, which accounts for the real usage and global and local pollutants emitted during a given time interval in the form of one of a calculation server or onboard electronics in one of a control unit or in a vehicle connected by wireless communication, the calculation of the pollution footprint being carried out by aggregating all pollution emissions linked to local and global pollutants in a single benchmark, the benchmark being a weighted sum of the emissions for each pollutant under consideration in grams per unit of distance of travel of the vehicle, coefficients of the weighted sum being selected as a function of impact on health and environment and;
   c) a connected object or a smart phone for exploiting the pollution footprint including a connected object which performs at least one of informing the user and the administrative authorities of the pollution footprint.

2. The system as claimed in claim 1, wherein the connected object comprises at least:
   a) a connected object or a smart phone for displaying the environmental footprint;
   b) a communication module for communicating with the smart phone, the server and the road infrastructure;
   c) a vehicle identification module for identifying the vehicle; and
   d) an energy storage and energy supply.

3. The system as claimed in claim 2, wherein the smart phone for measuring comprises at least one of a connected control unit, a connected vehicle and a connected wristwatch.

4. The system as claimed in claim 1, wherein the smart phone for measuring comprises at least one of a connected control unit, a connected vehicle and a connected wristwatch.

5. The system as claimed in claim 4 wherein the at least one connected object is integrated into a smart phone, a wirelessly connected control unit, a wirelessly connected vehicle or a wirelessly connected wristwatch.

6. The system as claimed in claim 1, wherein the calculating server for calculating the pollution footprint uses an onboard physical sensor for individual local pollutants.

7. The system as claimed in claim 6 wherein the at least one connected object is integrated into a smart phone, a wirelessly connected control unit, a wirelessly connected vehicle or a wirelessly connected wristwatch.

8. The system as claimed in claim 1, wherein the connected object or smart phone for exploiting the pollution footprint includes means for communicating with a road infrastructure of the trip.

9. The system as claimed in claim 8 wherein the at least one connected object is integrated into a smart phone, a wirelessly connected control unit, a wirelessly connected vehicle or a wirelessly connected wristwatch.

10. The system as claimed in claim 1, wherein the connected object or smart phone is a sticker which changes according to time.

11. The system as claimed in claim 10, wherein the sticker communicates the environmental footprint directly to the road infrastructure so that the user has access regulated areas or parking places.

12. The system as claimed in claim 10, wherein the sticker displays the environmental footprint of the user, by use of one of color coding or an indicator.

13. The system as claimed in claim 11, wherein the sticker displays the environmental footprint of the user, by use of one of color coding or an indicator.

14. A method for dynamic determination of an environmental footprint linked to the mobility of a user comprising the steps of:
   a) measuring a trip made by the user by use of a smart phone application detecting soft modes of mobility and modes of mobility in a motorized vehicle, and a style of driving;
   b) calculating the pollution footprint of the user for a time interval accounting for real usage and global and local pollutants emitted during the time interval, the calculation of the pollution footprint being carried out by aggregating all of pollution emissions linked to local and global pollutants in a single benchmark, the benchmark being a weighted sum of the emissions for each pollutant under consideration in grams per unit of distance of travel of the vehicle, coefficients of the weighted sum being selected as a function of impact on health and environment; and
   c) displaying the environmental footprint linked to the mobility of the user and information regarding the user and the administrative authorities by a mobile connection or a wireless connection.

15. The method as claimed in claim 14 in which, for calculation of the pollution footprint, pollution emissions linked to a motorized vehicle employed by the user are calculated by acquiring at least one macroscopic parameter relating to design of the vehicle by construction for the vehicle:

i) a model of the vehicle linking at least one of the position, altitude and speed of the vehicle to torque and speed of an engine of the vehicle by at least one macroscopic parameter;
  ii) a model of the engine linking the torque and the speed of the engine to pollution emissions in the exhaust from the engine by use of at least one macroscopic parameter; and
  iii) a model of the post-treatment system linking the pollution emissions in the exhaust from the engine by use of the pollution emissions in the exhaust from the post-treatment system by use of at least one macroscopic parameter;

and by carrying out steps of:

a) measuring position, altitude and speed of the vehicle by use of at least one of a tracking system and a mobile phone;
  b) determining the torque and speed of the engine by use of the vehicle model and the measurements;
  c) determining the pollution emissions in the exhaust from the engine by use of a model of the engine and the torque and the speed of the engine; and
  d) determining pollution emissions from the vehicle by use of the model of the post-treatment system and the pollution emissions in the exhaust from the engine.

16. The method as claimed in claim 14, wherein initially, a pollution footprint is calculated for each route j, then a mean pollution footprint is calculated for the series of n routes travelled over the time interval, comprising routes traversed in modes of mobility, with j being a whole number from varying 1 to n.

17. The method as claimed in claim 16, wherein the time interval ranges from 1 day to 1 month.

18. The method as claimed in claim 14, wherein the global pollutants are selected from carbon dioxide and greenhouse gases and the local pollutants are selected from oxides of nitrogen, carbon monoxide, fine particles, unburned hydrocarbons and sulphur dioxide.

* * * * *